(12) United States Patent
Liu et al.

(10) Patent No.: US 9,356,221 B2
(45) Date of Patent: May 31, 2016

(54) PIEZOELECTRIC VIBRATOR

(71) Applicants: Lin Liu, Shenzhen (CN); Zhiyong Tan, Shenzhen (CN)

(72) Inventors: Lin Liu, Shenzhen (CN); Zhiyong Tan, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 85 days.

(21) Appl. No.: 14/274,849

(22) Filed: May 12, 2014

(65) Prior Publication Data

US 2014/0333178 A1    Nov. 13, 2014

(30) Foreign Application Priority Data

May 13, 2013  (CN) .................. 2013 2 0257334 U

(51) Int. Cl.
| | |
|---|---|
| H01L 41/08 | (2006.01) |
| H01L 41/053 | (2006.01) |
| B06B 1/06 | (2006.01) |
| H01L 41/09 | (2006.01) |
| B06B 3/00 | (2006.01) |

(52) U.S. Cl.
CPC ............... *H01L 41/053* (2013.01); *B06B 1/06* (2013.01); *B06B 3/00* (2013.01); *H01L 41/0933* (2013.01)

(58) Field of Classification Search
USPC .................................................. 310/330–332
See application file for complete search history.

(56) References Cited

U.S. PATENT DOCUMENTS

| | | | |
|---|---|---|---|
| 8,878,420 B2* | 11/2014 | Liu ........................ | G06F 3/016 310/328 |
| 2012/0248935 A1* | 10/2012 | Liu ..................... | H01L 41/0933 310/326 |

* cited by examiner

*Primary Examiner* — J. San Martin
(74) *Attorney, Agent, or Firm* — IPro, PLLC; Na Xu

(57) ABSTRACT

Disclosed is piezoelectric vibrator including a piezoelectric vibrator unit. The piezoelectric vibrator has a vibrating portion, a mass attached on the vibrating portion and having an connecting portion attached on the vibrating portion and at least one extending portion extending from the connecting portion and away from the vibrating portion, and a holder having a stopping portion disposed between the extending portion of the mass and the vibrating portion. A distance from the extending portion to the at least one stopping portion is less than the amplitude of the vibration portion for limiting the vibrating portion and avoiding excessive amplitude of the vibrating portion.

6 Claims, 3 Drawing Sheets

PIEZOELECTRIC VIBRATOR

FIELD OF THE INVENTION

The present invention generally relates to the art of piezoelectric vibrators, more particularly to a piezoelectric vibrator used in an electronic device.

DESCRIPTION OF RELATED ART

Gradually, piezoelectric vibrators are widely used in many types of electronic devices having screens, such as mobile phones, for providing tactile vibration. Generally, a piezoelectric vibrator includes a pair of mounting portions assembled with the electronic device, a pair of fastening portions fixed on the device and a vibration portion connected with the pair of fastening portions for vibrating along a vibration direction.

However, the piezoelectric vibrator is unable to be adjusted the amplitude of the vibration portion. When the vibrating amplitude of the vibrating portion is increased, the vibration portion will impact upon other components of the electronic device near the piezoelectric vibrator. As a result, the vibrating portion will be broken.

DETAILED DESCRIPTION OF THE EXEMPLARY EMBODIMENT

Reference will now be made to describe the exemplary embodiment of the present invention in detail. The present invention is presented for providing the user with intensive interaction experience. For example, if a user taps on a touch screen of a portable gaming, the user will get a tactile feedback, such as vibration, from the touch screen.

Figure 1:
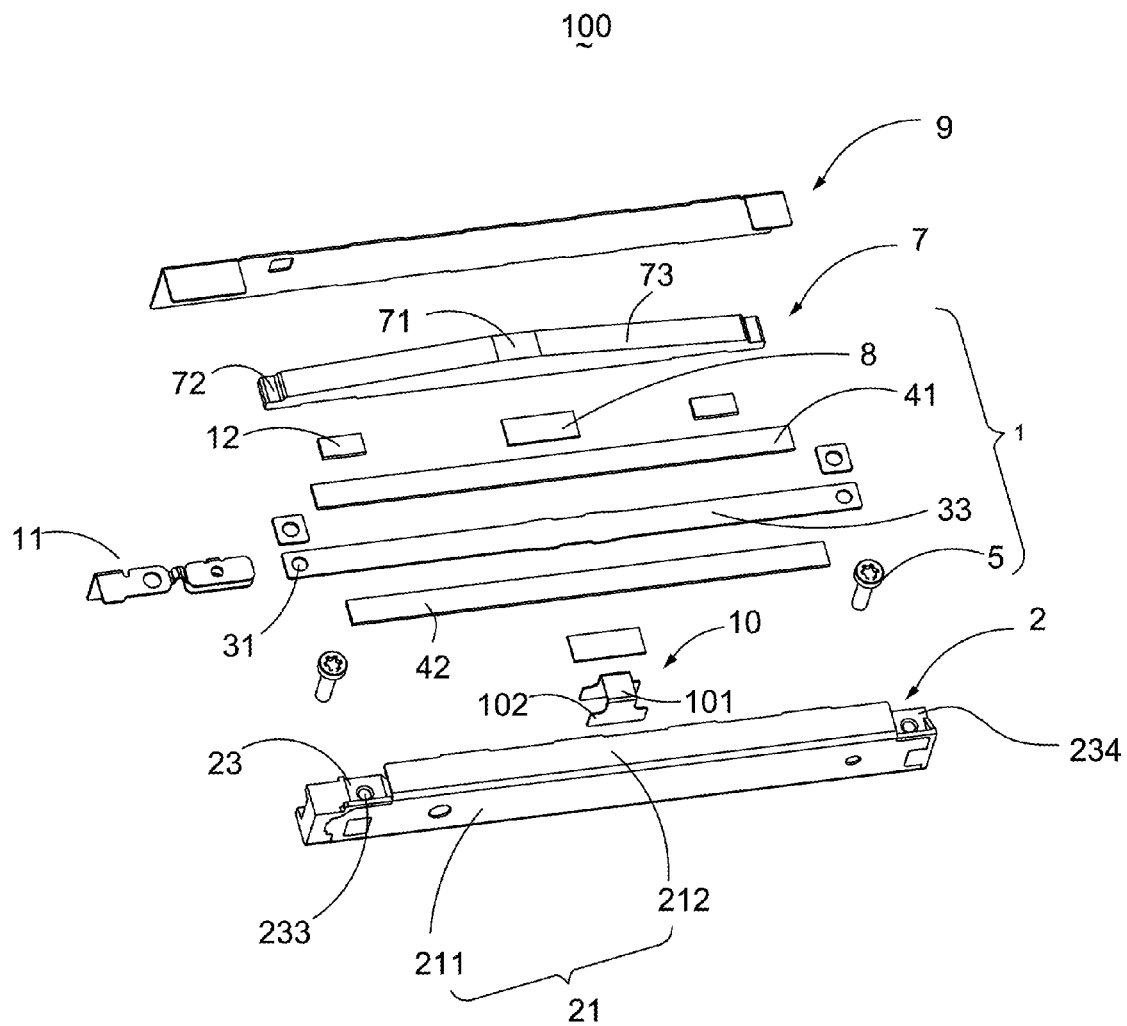
FIG. 1 is an illustrative exploded view of a piezoelectric vibrator in accordance with an exemplary embodiment of the present invention.

Referring to FIG. 1, an piezoelectric vibrator 100 for providing vibration, in accordance with an exemplary embodiment of the present invention includes a holder 2, a piezoelectric vibrator unit 1 mounted on the holder 2 for vibrating along a vibrating direction, a terminal 11 fixed on the holder 2 and electrically connected to the piezoelectric vibrator unit 1, and a pair of fixing portions 5 for fixing the piezoelectric vibrator unit 1 and the terminal 11 on the holder 2, respectively.

Figure 2:
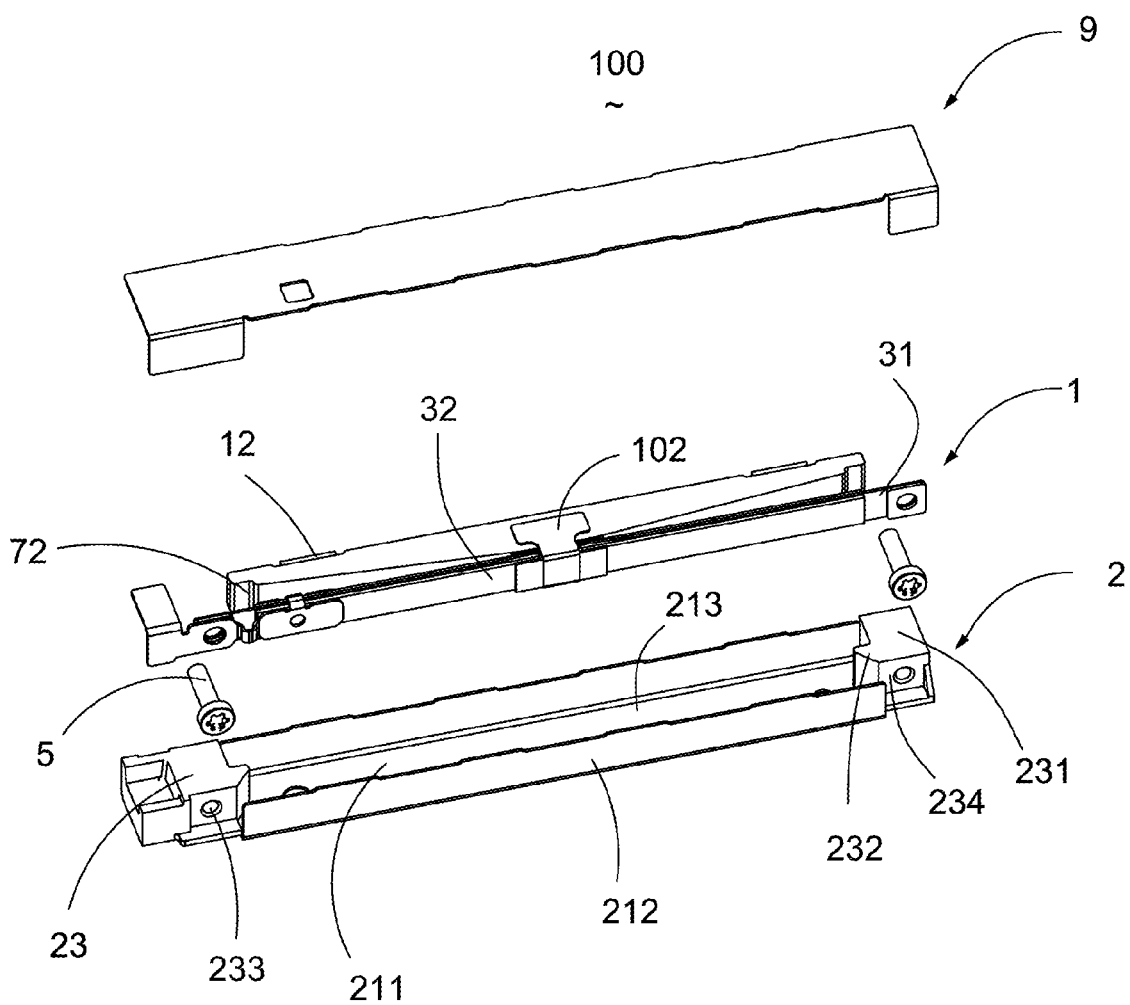
FIG. 2 is an illustrative partially exploded view of the piezoelectric vibrator in FIG. 1.

Referring to FIGS. 1 and 2, the piezoelectric vibrator unit 1 comprises a pair of fastening portions 31, a vibration portion 32 connected with the pair of fastening portions 31 for vibrating along the vibration direction, a mass 7 attached on the vibrating portion 32, a coupling portion 10 for coupling the mass 7 with the vibrating portion 32 as a whole, and a first spacer 8 sandwiched between the vibrating portion 32 and the mass 7. The vibrating portion 32 comprises a substrate 33 connecting with the fastening portions 31, a first piezoelectric layer 41 attached to a side of the substrate 33 and a second piezoelectric layer 42 attached to another side of the substrate 33. The mass 7 attached to one of the piezoelectric layers 41, 42, for example, the first piezoelectric layer 41. Two piezoelectric layers 41, 42 are used to enhance the vibration of the vibrating portion 32. In fact, only one piezoelectric layer can also make the piezoelectric vibrator unit 1 vibrate.

The mass 7 has a connecting portion 71 attached on the first piezoelectric layer 41 and at least one extending portion 73 extending from the connecting portion 71 and away from the vibration portion 32. In this embodiment, the mass 7 has a pair of extending portions 73 extending from two ends of the connecting portion 71 and away from the vibration portion 32. Another word, the connecting portion 71 serves as a middle portion attached to the side of the first piezoelectric layer 41. Each distal end of the extending portion 73 has a receiving concave 72 towards the vibration portion 32 and a receiving groove 74 far away from the vibration portion 32 for receiving a second spacer 12. Along a direction from a portion of each extending portion 73 adjacent to the connecting portion 71 toward the distal end of each of extending portions 73, a distance between the first piezoelectric layer 41 and each of extending portions 73 gradually increases, which provides the vibration portion 32 with more vibrating amplitude. The first and second spacer 8, 12 are made of elastic material for reducing the noise generated by collision of the mass 7 together with the metal plate 21 and the vibration portion 32 and protecting the mass 7, the metal plate 21 and the vibration portion 32.

Figure 3:
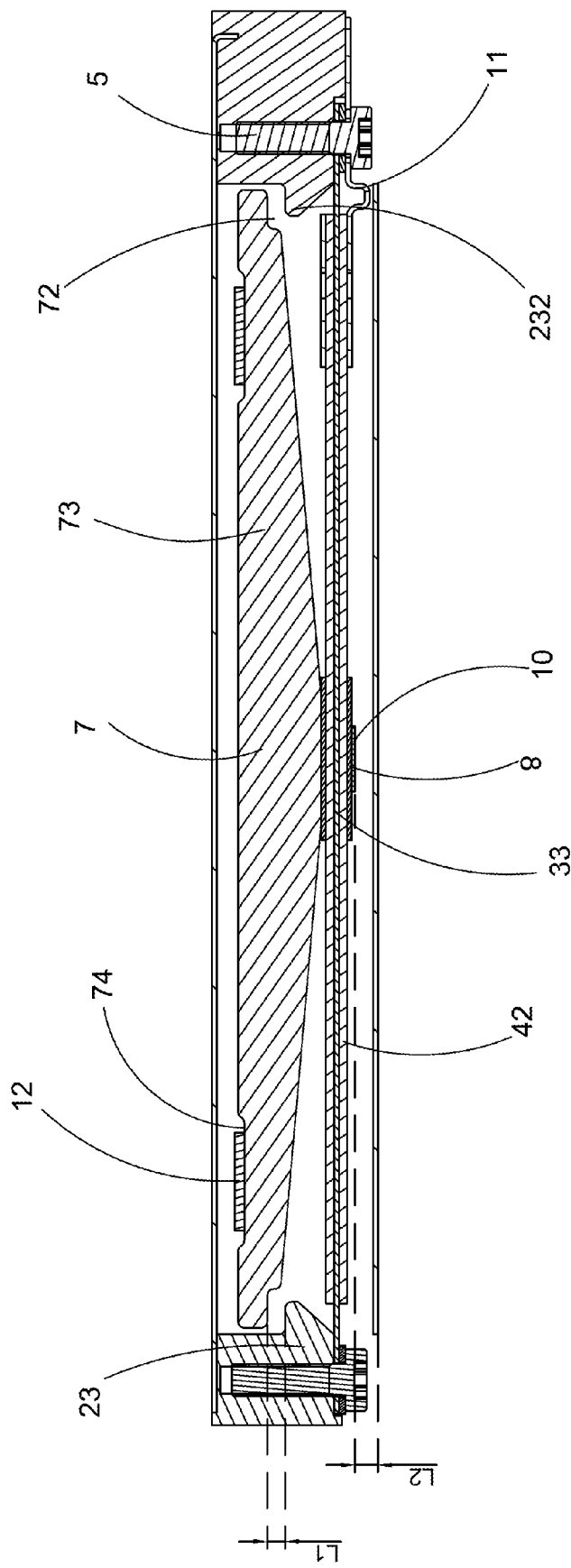
FIG. 3 is an illustrative cross-sectional view of the piezoelectric vibrator in FIG. 1.

Referring to FIGS. 2 and 3, along with FIG. 1, the holder 2 comprises a plastic base 23, a metal plate 21 assembled with the plastic base 23 by injection molding for improving the mechanical strength of the piezoelectric vibrator 100 and a cover 9 covering on the metal plate 21. The plastic base 23 has a pair of mounting portions 231 spaced apart from each other for fixing the piezoelectric vibrator unit 1, and at least one stopping portion 232 extending from the mounting portion 231 towards the piezoelectric vibrator unit 1. Each of the mounting portions 231 has a mounting surface 234 for holding the fastening portion 31 of the piezoelectric vibrator unit 1 and a mounting hole 231 with screw threads thereon exposed from the mounting surface 234. When the piezoelectric vibrator unit 1 is assembled on the mounting portion 23, each of the substrate 33, the piezoelectric layers 41, 42 and the mass 7 are substantially perpendicular to the mounting surface 234 of the mounting portion 23. A distance between each of extending portions 73 and the at least one stopping portion 232 is less than that the amplitude of the vibrating portion 32 for limiting the vibrating of the vibration portion 32 and avoiding excessive amplitude of the vibration portion 32. When the vibration portion 32 of the piezoelectric vibrator unit 1 vibrates towards the holder 2 along the vibrating direction, the receiving concave 72 of the piezoelectric vibrator unit 1 will receive the stopping block 232 of the holder 2, thereby limiting the vibration portion 32.

The metal plate 21 of the holder 2 has a bottom wall 211 assembled with the mounting portions 231 and perpendicular to the mounting surface 234, a pair of side walls 212 upwardly extending from the bottom wall 211 and opposite to each other, and a receiving space 213 formed by the bottom wall 211 and the side walls 212. The mounting surfaces 234 are spaced apart from the side walls 212 of the metal plate 21 for receiving the fastening portions 31 of the piezoelectric vibrator unit 1. The metal plate 21 is assembled with the plastic base 23 by injection molding, thereby forming an integral unit. While assembled, the distance between at least one of the extending portions 73 and the at least one stopping portion 232 is less than a distance between the vibrating portion 32 and the side wall 212 of the metal plate 21 near the mounting surface 234 of the mounting portion 23 for preventing the vibration portion 32 from impacting upon the side wall 212 near the mounting surface 234. When the vibration portion 32 of the piezoelectric vibrator unit 1 vibrates towards the holder 2 along the vibrating direction, the receiving concave 72 of the piezoelectric vibrator unit 1 will receive the stopping block 232 of the holder 2, thereby preventing the vibration portion 32 from impacting upon the side wall 212 near the mounting surface 234 of the mounting portion 23 and protecting the vibration portion 32 of the piezoelectric vibrator unit 1.

For firmly positioning the mass, the coupling portion 10 with a U-shaped plate comprises an engaging portion 101 attached on the connecting portion 71 and a pair of swings 102 extending perpendicularly from the engaging portion 101 for coupling the connecting portion 71 of the mass 7 together with the engaging portion 101.

In the exemplary embodiment, the mounting hole 231 may comprise screws. In an alternative embodiment, the fixing portions may comprise rivets. The fixing portions 5 fix the mass and piezoelectric vibrator unit 1 on the holder 2, which makes the assembling process much easier.

According to the piezoelectric vibrator, the distance between the extending portion and the stopping portion is less than that the amplitude of the vibrating portion for limiting the vibration portion and avoiding excessive amplitude of the vibration portion, thereby protecting other components around the piezoelectric vibrator when the vibrating amplitude of the piezoelectric vibrator is increased.

While the present invention has been described with reference to the specific embodiment, the description of the invention is illustrative and is not to be construed as limiting the invention. Various of modifications to the present invention can be made to the exemplary embodiment by those skilled in the art without departing from the true spirit and scope of the invention as defined by the appended claims.

What is claimed is:

1. A piezoelectric vibrator, comprising:
   a piezoelectric vibrator unit having a pair of fastening portions, a vibration portion connected with the pair of fastening portions for vibrating along a vibration direction, and a mass attached on the vibration portion, the mass having an connecting portion attached on the vibrating portion and at least one extending portion extending from the connecting portion and away from the vibrating portion;
   a holder having a pair of mounting portions spaced apart from each other for fixing the fastening portions of the piezoelectric vibrator unit and at least one stopping portion extending from the mounting portion and disposed between the extending portion of the mass and the vibrating portion;
   wherein, a distance between the extending portion and the at least one stopping portion is less than the amplitude of the vibration portion for limiting the vibration of the vibrating portion and avoiding excessive amplitude of the vibration portion; and
   wherein each distal end of the extending portion has a receiving concave towards the vibration portion for receiving the at least one stopping portion.

2. The piezoelectric vibrator as described in claim 1 further comprising a metal plate assembled with the mounting portions, the metal plate having a bottom wall assembled with the mounting portion and at least a side wall upwardly extending from the bottom wall and spaced apart from the mounting portions, the distance from the extending portion to the at least one stopping portion being less than a distance from the vibrating portion to the side wall of the metal plate.

3. The piezoelectric vibrator as described in claim 2, wherein each of the mounting portions has a mounting surface perpendicular to the bottom wall for mounting the fastening portions.

4. The piezoelectric vibrator as described in claim 1, wherein the mounting surface is perpendicular to the vibration portion and the mass.

5. The piezoelectric vibrator as described in claim 1 further comprising a coupling portion for coupling the mass with the vibrating portion as a whole.

6. The piezoelectric vibrator as described in claim 5, wherein the coupling portion has an engaging portion and a pair of swings extending perpendicularly from the engaging portion for coupling the connecting portion of the mass together with the engaging portion.

* * * * *